(12) United States Patent
Obata et al.

(10) Patent No.: US 9,656,662 B2
(45) Date of Patent: May 23, 2017

(54) HYBRID VEHICLE

(71) Applicant: TOYOTA JIDOSHA KABUSHIKI KAISHA, Toyota-shi, Aichi-ken (JP)

(72) Inventors: Hiroyuki Obata, Nagoya (JP); Teruo Ishishita, Miyoshi (JP); Koichiro Muta, Okazaki (JP); Hideki Kamatani, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/175,431

(22) Filed: Jun. 7, 2016

(65) Prior Publication Data
US 2016/0362099 A1  Dec. 15, 2016

(30) Foreign Application Priority Data
Jun. 9, 2015  (JP) .................. 2015-116496

(51) Int. Cl.
*G01R 31/36* (2006.01)
*B60L 11/14* (2006.01)
(Continued)

(52) U.S. Cl.
CPC .............. *B60W 20/13* (2016.01); *B60K 6/28* (2013.01); *B60K 6/442* (2013.01); *B60L 11/14* (2013.01); *B60W 10/06* (2013.01); *B60W 10/08* (2013.01); *B60W 10/26* (2013.01); *B60W 20/20* (2013.01); *B60W 30/188* (2013.01);
(Continued)

(58) Field of Classification Search
CPC .... B60W 20/13; B60W 10/08; B60W 30/188; B60W 10/06; B60W 20/20; B60W 10/26; B60W 2510/248; B60W 2510/244; B60W 2710/244; G01R 31/3651; G01R 31/3679; G01R 31/007; B60K 6/28; B60K 6/442;
(Continued)

(56) References Cited

U.S. PATENT DOCUMENTS

2007/0093359 A1  4/2007  Kobayashi et al.
2011/0161025 A1*  6/2011  Tomura .............. G01R 31/3651
                                                   702/63

(Continued)

FOREIGN PATENT DOCUMENTS

EP  2127983 A1  12/2009
EP  2660615 A1  11/2013
(Continued)

*Primary Examiner* — Rodney Butler
(74) *Attorney, Agent, or Firm* — Oliff PLC

(57) ABSTRACT

In a hybrid vehicle, an ECU executes a forced charging control for forcibly charging a battery by using an engine and a vehicle driving device in a case where a remaining capacity of the battery is equal to or less than a predetermined value. In a case where an evaluation value shows a degree of deterioration of the battery attributable to excessive charging, the ECU uses a first electric power as an electric charging power for charging the battery when an absolute value of the evaluation value is equal to or lower than a first threshold, and uses a second electric power falling short of the first electric power as the electric charging power for charging the battery when the absolute value of the evaluation value is higher than the first threshold in a case where the forced charging control is executed while the hybrid vehicle is stopped.

12 Claims, 5 Drawing Sheets

(51) Int. Cl.

| | | |
|---|---|---|
| *B60K 6/28* | (2007.10) | |
| *B60K 6/44* | (2007.10) | |
| *B60W 10/06* | (2006.01) | |
| *B60W 30/18* | (2012.01) | |
| *B60W 20/13* | (2016.01) | |
| *B60K 6/442* | (2007.10) | |
| *B60W 10/08* | (2006.01) | |
| *B60W 10/26* | (2006.01) | |
| *B60W 20/20* | (2016.01) | |
| *B60W 30/188* | (2012.01) | |
| *G01R 31/00* | (2006.01) | |

(52) U.S. Cl.
CPC ..... *G01R 31/3651* (2013.01); *G01R 31/3679* (2013.01); *B60W 2510/244* (2013.01); *B60W 2510/248* (2013.01); *B60W 2710/244* (2013.01); *B60Y 2200/92* (2013.01); *B60Y 2300/91* (2013.01); *G01R 31/007* (2013.01); *Y10S 903/907* (2013.01); *Y10S 903/93* (2013.01)

(58) Field of Classification Search
CPC .... B60L 11/14; Y10S 903/93; Y10S 903/907; B60Y 2200/92; B60Y 2300/91
See application file for complete search history.

(56) References Cited

U.S. PATENT DOCUMENTS

| | | | |
|---|---|---|---|
| 2014/0176085 A1 | 6/2014 | Maruno et al. | |
| 2015/0295293 A1* | 10/2015 | Kawashima | ........ H01M 8/0494 |
| | | | 429/9 |
| 2016/0351976 A1* | 12/2016 | Kawahara | ............ H01M 10/48 |

FOREIGN PATENT DOCUMENTS

| | | |
|---|---|---|
| FR | 2892348 A1 | 4/2007 |
| JP | 2013-125607 A | 6/2013 |

* cited by examiner

HYBRID VEHICLE

INCORPORATION BY REFERENCE

The disclosure of Japanese Patent Application No. 2015-116496 filed on Jun. 9, 2015 including the specification, drawings and abstract is incorporated herein by reference in its entirety.

BACKGROUND

1. Technical Field

The disclosure relates to a hybrid vehicle and, more particularly, to a control technique for suppressing deterioration of a secondary battery that is mounted on the hybrid vehicle.

2. Description of Related Art

Japanese Patent Application Publication No. 2013-125607 (JP 2013-125607 A) discloses a control device for a secondary battery that is mounted on a vehicle. This control device suppresses a high-rate deterioration of the secondary battery. According to JP 2013-125607 A, the high-rate deterioration is deterioration that is attributable to a salt concentration bias of the secondary battery resulting from charging and discharging continuously at a high rate. This control device calculates an evaluation value $\Sigma D(N)$ that shows a degree of the high-rate deterioration of the secondary battery. This evaluation value $\Sigma D(N)$ is defined in view of a progress of the high-rate deterioration attributable to charging entailed by an increase in secondary battery charging rate. In a case where the evaluation value $\Sigma D(N)$ reaches a predetermined threshold that shows the deterioration attributable to excessive charging, the control device reduces an input electric power upper limit value (Win) that shows a limit value of the electric power with which the secondary battery is charged.

In this manner, the upper limit value of the charging electric power for the secondary battery is lowered by the control device in a case where the secondary battery undergoes the high-rate deterioration to some extent. As a result, the control device can suppress the deterioration of the secondary battery.

The inventors have found that a gradual salt concentration bias of the secondary battery occurs and the evaluation value $\Sigma D(N)$ increases in a direction showing the excessive charging, even if the charging and discharging at a high rate do not continue to be performed, in a case where traveling is performed for a long period of time. In the following description, the "high-rate deterioration" will further include the deterioration of the secondary battery resulting from the salt concentration bias of the secondary battery occurring even if the charging and discharging at a high rate are not continuously performed.

In a case where the evaluation value $\Sigma D(N)$ reaches the predetermined threshold that shows the deterioration attributable to excessive charging, the input electric power upper limit value is lowered, as in JP 2013-125607 A, so that the progress of the high-rate deterioration is suppressed. In this case, the amount of energy that can be recovered to the battery decreases, and thus fuel efficiency of the vehicle is worsened. In a case where the input electric power upper limit value is not lowered when the deterioration attributable to excessive charging occurs, the high-rate deterioration of the secondary battery is accelerated.

The progress of the high-rate deterioration of the secondary battery to the point of the evaluation value $\Sigma D(N)$ reaching the predetermined threshold that shows the deterioration attributable to excessive charging might lead to a demerit in the form of the worsening of the fuel efficiency of the vehicle or the more rapid progress of the high-rate deterioration.

SUMMARY

The embodiments provide a hybrid vehicle that suppresses a degree of progress of high-rate deterioration of the vehicle's secondary battery.

A hybrid vehicle according to one aspect includes an internal combustion engine, a vehicle driving device, a secondary battery, a current sensor, and an electronic control unit. The vehicle driving device (i) generates a driving force for the hybrid vehicle by receiving electric power and (ii) generates electric power from power of the internal combustion engine. The secondary battery inputs and outputs electric power to and from the vehicle driving device. The current sensor detects a current input to and output from the secondary battery. The electronic control unit (a) controls charging and discharging of the secondary battery and (b) calculates, using an output of the current sensor, an evaluation value showing a degree of deterioration of the secondary battery attributable to a salt concentration bias of the secondary battery resulting from the charging and discharging. In addition, the electronic control unit (c) executes a forced charging control to charge the secondary battery by using the internal combustion engine and the vehicle driving device in a case where a remaining capacity of the secondary battery is equal to or less than a first predetermined value, the forced charging control forcibly charging the secondary battery until the remaining capacity rises to a second predetermined value exceeding the first predetermined value. Stopping of the internal combustion engine is prohibited during the execution of the forced charging control. An absolute value of the evaluation value increases with a progress of the deterioration of the secondary battery. In a case where the evaluation value shows the degree of the deterioration of the secondary battery that is attributable to excessive charging, the electronic control unit uses a first electric power as an electric charging power for charging the secondary battery when the absolute value of the evaluation value is equal to or lower than a first threshold, and uses a second electric power falling short of the first electric power as the electric charging power for charging the secondary battery when the absolute value of the evaluation value is higher than the first threshold in a case where the forced charging control is executed while the hybrid vehicle is stopped.

According to this configuration, charging electric power at a time of the forced charging control during the vehicle stop decreases in a case where a high-rate deterioration of the secondary battery is in progress. The decrease in the charging electric power causes a progress of the salt concentration bias to be suppressed. As a result, this electronic control unit can suppress the degree of the progress of the high-rate deterioration of the secondary battery without significantly affecting traveling of the hybrid vehicle.

Preferably, the electronic control unit may use a third electric power falling short of the second electric power as the electric charging power for charging the secondary battery when the absolute value of the evaluation value is higher than a second threshold higher than the first threshold in a case where the forced charging control is executed while the hybrid vehicle is stopped.

According to this configuration, a more appropriate charging electric power can be selected in accordance with the degree of the progress of the high-rate deterioration than in a case where the charging electric power is determined based on whether or not the absolute value of the evaluation value exceeds the first threshold of one stage.

Preferably, the electronic control unit may reduce the electric power for charging the secondary battery as a difference between the absolute value of the evaluation value and the first threshold increases, when the absolute value of the evaluation value is higher than the first threshold in a case where the forced charging control is executed while the hybrid vehicle is stopped.

According to this configuration, a more appropriate charging electric power can be selected in accordance with the degree of the progress of the high-rate deterioration than in a case where the charging electric power is determined based on whether or not the absolute value of the evaluation value exceeds the first threshold of one stage.

Preferably, an input electric power upper limit value showing a limit value of the input electric power may be set for the secondary battery. The electronic control unit may limit the input electric power upper limit value more when the absolute value of the evaluation value is higher than a third threshold higher than the first threshold than when the absolute value of the evaluation value is equal to or lower than the third threshold in a case where the forced charging control is executed while the hybrid vehicle is stopped.

According to this configuration, the degree of the progress of the high-rate deterioration is even more effectively suppressed. A decrease in the input electric power upper limit value leads to fuel efficiency worsening as described above. According to embodiments, however, the degree of the progress of the high-rate deterioration of the secondary battery is suppressed beforehand at a point in time when the absolute value of the evaluation value exceeds the first threshold. Accordingly, the evaluation value is less likely to exceed the third threshold than in the related art in the first place even if a control is executed for lowering an upper limit of the electric power input to the secondary battery in a case where the absolute value of the evaluation value exceeds the third threshold. Accordingly, the upper limit of the electric power input to the secondary battery is less likely to be lowered than in the related art. As a result, the likelihood of the fuel efficiency exacerbation is reduced as well.

Preferably, an input electric power upper limit value showing a limit value of the input electric power may be set for the secondary battery. The electronic control unit may reduce the input electric power upper limit value as the absolute value of the evaluation value increases and may limit the input electric power upper limit value more gradually in a case where the electric power for charging the secondary battery is the second electric power than in a case where the electric power for charging the secondary battery is the first electric power.

According to this configuration, the limitation of the input electric power upper limit value with respect to an increase in the evaluation value is relaxed by the electric power for charging the secondary battery being reduced. As a result, the worsening of the fuel efficiency can be suppressed.

According to the aspects described above, the degree of the progress of the high-rate deterioration can be suppressed in the hybrid vehicle in which the secondary battery is mounted.

BRIEF DESCRIPTION OF THE DRAWINGS

Features, advantages, and technical and industrial significance of exemplary embodiments will be described below with reference to the accompanying drawings, in which like numerals denote like elements, and wherein.

DETAILED DESCRIPTION OF EMBODIMENTS

Figure 1:
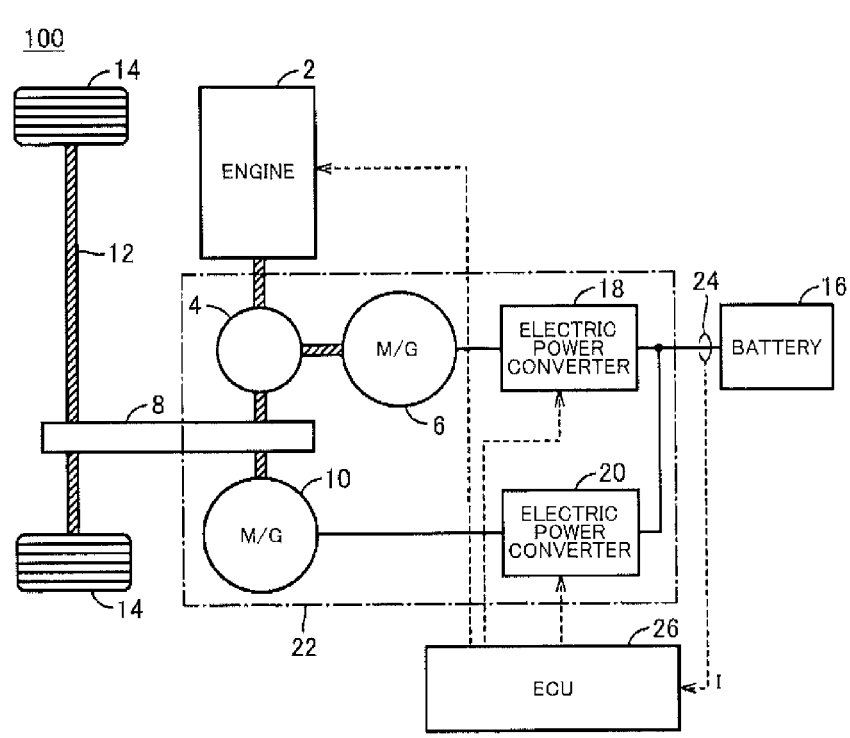
FIG. 1 is a block diagram illustrating an overall configuration of a hybrid vehicle according to Embodiment 1.

Hereinafter, embodiments will be described in detail with reference to accompanying drawings. The same reference numerals will be used to refer to the same or corresponding parts in the drawings, and description thereof will not be repeated, (Embodiment 1)

<1. Configuration of Hybrid Vehicle>

FIG. 1 is a block diagram showing an overall configuration of a hybrid vehicle according to an embodiment. Referring to FIG. 1, a hybrid vehicle 100 is provided with an engine 2, a vehicle driving device 22, a transmission gear 8, a drive shaft 12, vehicle wheels 14, a battery 16, and an electronic control unit (ECU) 26.

The engine 2 is an internal combustion engine that outputs power by converting thermal energy that results from fuel combustion to kinetic energy of a mover such as a piston and a rotor. A hydrocarbon-based fuel such as gasoline, diesel, ethanol, liquid hydrogen, and natural gas or a liquid or gaseous hydrogen fuel is suitable as a fuel of the engine 2.

The vehicle driving device 22 is configured to be capable of generating a vehicle driving force based on electric power and generating electric power. Specifically, the vehicle driving device 22 includes a power split device 4, motor generators 6, 10, and electric power converters 18, 20.

The motor generators 6, 10 are AC rotating electric machines such as three-phase AC synchronous motors with permanent magnets embedded in rotors. The motor generator 6 is used as a generator that is driven by the engine 2 via the power split device 4. The motor generator 6 is used also as an electric motor for starting the engine 2. The motor generator 10 is operated mainly as an electric motor and drives the drive shaft 12. During braking of the vehicle and deceleration, the motor generator 10 is operated as a generator and performs regenerative electric power generation, The power split device 4 includes, for example, a planetary gear mechanism that has the three rotary shafts of a sun gear, a carrier, and a ring gear. The power split device 4 splits a driving force of the engine 2 into power that is transmitted to a rotary shaft of the motor generator 6 and power that is transmitted to the transmission gear 8. The transmission gear 8 is connected to the drive shaft 12 for driving the vehicle wheels 14. The transmission gear 8 also is connected to a rotary shaft of the motor generator 10.

The battery 16 is a rechargeable secondary battery. For example, the battery 16 is a secondary battery such as a nickel-hydrogen battery or a lithium-ion battery. The battery 16 supplies electric power to the electric power converters 18, 20, During electric power generation by the motor generator 6 and/or 10, the battery 16 is charged by receiving electric power generated by the motor generator 6 and/or 10. A current sensor 24 detects a current I that is input to and output from the battery 16 (detects an output (discharging) from the battery 16 as a positive value and an input (charging) to the battery 16 as a negative value) and outputs the detected value to the ECU 26.

A remaining capacity of the battery 16 is shown by, for example, a SOC that shows a current electric power storage amount with respect to a fully charged state of the battery 16 as a percentage. The SOC is calculated based on, for example, the value that is detected by the current sensor 24 and/or a value that is detected by a voltage sensor (not illustrated). The SOC may be calculated by the ECU 26 or may be calculated by an ECU that is separately disposed in the battery 16.

The electric power converter 18 executes two-way DC/AC electric power conversion between the motor generator 6 and the battery 16 based on a control signal that is received from the ECU 26. Likewise, the electric power converter 20 executes two-way DC/AC electric power conversion between the motor generator 10 and the battery 16 based on the control signal that is received from the ECU 26. In this manner, the motor generators 6, 10 can output a positive torque for the operation as an electric motor or a negative torque for the operation as a generator via electric power exchange with the battery 16. The electric power converters 18, 20 are configured to have, for example, an inverter. A boost converter for DC voltage conversion can be placed between the battery 16 and the electric power converters 18, 20.

The ECU 26 includes a central processing unit (CPU), a storage device (memory), an I/O buffer, and the like (none of which is illustrated herein), and performs controls on respective pieces of equipment in the hybrid vehicle 100. These controls are not limited to software-based processing and can be processing based on dedicated hardware (electronic circuit).

In a case where the SOC of the battery 16 is reduced, the ECU 26 executes a control for forcibly charging the battery 16. Specifically, in a case where the SOC is reduced to a predetermined lower limit value, the ECU 26 starts the engine 2 and forcibly charges the battery 16 so that the SOC rises to a predetermined value which is higher than the lower limit value. During this control, the engine 2 continues to operate, without stopping, until the SOC of the battery 16 reaches the predetermined value. This control will be referred to as a "forced charging control" below. Details of the forced charging control will be described in detail later.

The ECU 26 also evaluates a degree of high-rate deterioration of the battery 16. A method for calculating an evaluation value $\Sigma D(N)$ that shows the degree of the high-rate deterioration of the battery 16 will be described in detail later. This evaluation value $\Sigma D(N)$ shows a negative value in a case where a salt concentration bias occurs due to the use of the battery 16 in an excessively charged manner and shows a positive value in a case where the salt concentration bias occurs due to the use of the battery 16 in an excessively discharged manner.

Upon the evaluation value $\Sigma D(N)$ reaching a lower limit threshold (negative value), the ECU 26 limits an input electric power upper limit value Win that shows a limit value of the electric power with which the battery 16 is charged (which is input to the battery 16). Upon the evaluation value $\Sigma D(N)$ reaching an upper limit threshold (positive value), the ECU 26 limits an output electric power upper limit value Wout that shows a limit value of the electric power which is discharged (output) from the battery 16. In this manner, the charging electric power and the discharging electric power are suppressed and a progress of the salt concentration bias is suppressed. As a result, a progress of the high-rate deterioration is suppressed. Herein, to "limit" the input electric power upper limit value Win means reducing a magnitude of the electric power with which the battery 16 is allowed to be charged. To "limit" the output electric power upper limit value Wout means reducing a magnitude of the electric power that can be discharged by the battery 16.

The inventors have found that a gradual salt concentration bias of the secondary battery occurs and the evaluation value $\Sigma D(N)$ increases in a negative direction even if the charging and discharging at a high rate do not continue to be performed. A limitation of the input electric power upper limit value Win for suppressing the increase in the evaluation value $\Sigma D(N)$ in the negative direction in this regard causes the amount of energy that can be recovered for the battery 16 to decrease. As a result, fuel efficiency of the hybrid vehicle 100 is reduced. Accordingly, it is desirable to suppress a degree of progress of the evaluation value $\Sigma D(N)$ before the evaluation value $\Sigma D(N)$ reaches the lower limit threshold at which the input electric power upper limit value Win is limited.

A method for limiting the charging electric power during the forced charging control is conceivable as a method for suppressing the degree of progress of the evaluation value $\Sigma D(N)$ before the evaluation value $\Sigma D(N)$ reaches the lower limit threshold at which the input electric power upper limit value Win is limited. During traveling of the vehicle, however, the hybrid vehicle 100 requires a large amount of electric power, and thus the necessity of forced charging is high. Meanwhile, during non-traveling of the vehicle, the hybrid vehicle 100 does not require a large amount of electric power, and thus the necessity of the forced charging is lower than during the traveling. In this case, a demerit is relatively small even if the charging electric power is limited.

In a case where the evaluation value $\Sigma D(N)$ shows the degree of the deterioration of the battery 16 attributable to excessive charging in the hybrid vehicle 100 according to Embodiment 1, the ECU 26 adopts a first electric power as the electric power for charging the battery 16 when an absolute value of the evaluation value $\Sigma D(N)$ is equal to or lower than a first threshold in a case where the forced charging control is executed while the vehicle is stopped. When the absolute value of the evaluation value $\Sigma D(N)$ is higher than the first threshold, a second electric power that falls short of the first electric power is adopted as the electric power for charging the battery 16. The above-described first threshold is set within a range that does not reach the lower limit threshold at the time when the input electric power upper limit value Win is limited. In summary, in the hybrid vehicle 100, the charging electric power during the forced charging control while the vehicle is stopped is limited in a stage preceding the reduction in the evaluation value $\Sigma D(N)$ to the level at which the input electric power upper limit value Win is limited.

Since the charging electric power is limited in the forced charging control during the non-traveling of the vehicle, the degree of the progress of the high-rate deterioration of the secondary battery is suppressed, with the traveling not being significantly affected, in this hybrid vehicle 100. Accordingly, the secondary battery is unlikely to deteriorate to an extent that might require a significant reduction in the input electric power upper limit value Win.

Hereinafter, the method for calculating the evaluation value $\Sigma D(N)$ that shows the degree of the deterioration of the battery 16 of the hybrid vehicle 100 will be described, and then the forced charging control will be described.

<2. Method for Calculating Evaluation Value $\Sigma D(N)$ Showing Degree of Battery Deterioration>

In the hybrid vehicle 100, the evaluation of the degree of the deterioration of the battery 16 is performed with the evaluation value $\Sigma D(N)$. The evaluation value $\Sigma D(N)$ is calculated by integration of damage values $D(N)$ that show the degrees of the high-rate deterioration occurring in the battery 16 in respective cycles $\Delta t$. The damage value $D(N)$ is calculated in view of a damage value $D(-)$ that shows a degree of high-rate deterioration reduction in the cycle $\Delta t$ and a damage value $D(+)$ that shows a degree of high-rate deterioration increase in the cycle $\Delta t$.

Figure 2:
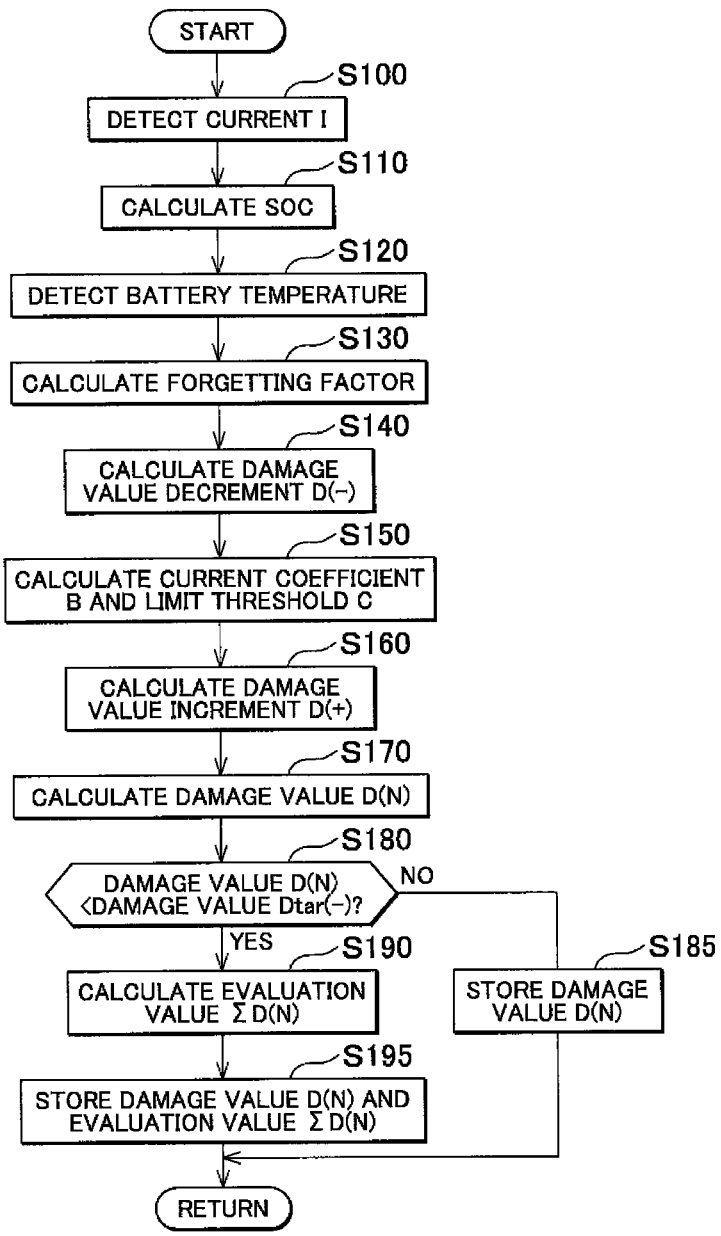
FIG. 2 is a flowchart illustrating a method for calculating an evaluation value that shows a degree of high-rate deterioration of a battery.

FIG. 2 is a flowchart illustrating the method for calculating the evaluation value $\Sigma D(N)$ that shows the degree of the high-rate deterioration of the battery. Referring to FIG. 2, the ECU 26 acquires a current value of the current I from the current sensor 24 (Step S100). As described above, the current value of the current I is a positive value during the discharging of the battery 16 and is a negative value during the charging of the battery 16. After the current value of the current I is acquired, the ECU 26 calculates the SOC based on the current value of the current I (Step S110). After the SOC calculation, the ECU 26 acquires temperature information showing a temperature of the battery 16 via a temperature sensor (not illustrated) which is disposed in the battery 16 (Step S120).

After the acquisition of the temperature information, the ECU 26 calculates a forgetting factor based on the SOC calculated in Step S110 and the temperature information acquired in Step S120 (Step S130). The forgetting factor is a coefficient correlated with a rate of diffusion of ions in the electrolyte of the battery 16. The forgetting factor is set within a range that satisfies the condition of the following Formula (1).

$$0 < \alpha \times \Delta t < 1 \qquad (1)$$

In Formula (1), α represents the forgetting factor and $\Delta t$ represents the cycle $\Delta t$ at a time when the processing that is illustrated in FIG. 2 is repeatedly executed. In the hybrid vehicle 100, a table is stored in a memory (not illustrated) and this table allows the forgetting factor to be specified insofar as the temperature and SOC of the battery 16 are specified. This table is drawn up in advance through experimentation regarding a relationship between the temperature and SOC of the battery 16 and the forgetting factor. The ECU 26 can calculate the forgetting factor by referring to this table.

After the calculation of the forgetting factor, the ECU 26 calculates the damage value $D(-)$ that shows a decrement in the damage value which shows the degree of the deterioration of the battery 16 (Step S140). The damage value $D(-)$ is calculated based on a degree of a decrease in the salt concentration bias resulting from the ion diffusion between the calculation of the damage value $D(N-1)$ pertaining to the immediately preceding cycle $\Delta t$ and the passage of one cycle $\Delta t$. For example, the ECU 26 can calculate the damage value $D(-)$ based on the following Formula (2).

$$D(-) = \alpha \times \Delta t \times D(N-1) \qquad (2)$$

In Formula (2), α and $\Delta t$ are the same as in Formula (1). $D(N-1)$ represents the damage value calculated in the immediately preceding cycle $\Delta t$. $D(0)$ as an initial value can be, for example, 0. As is apparent from Formula (2), the damage value $D(-)$ increases as the forgetting factor α increases and the cycle $\Delta t$ lengthens.

After the calculation of the damage value $D(-)$, the ECU 26 calculates a current coefficient B and a limit threshold C (Step S150), Specifically, the ECU 26 calculates the current coefficient B and the limit threshold C by the following method. The current coefficient B and the limit threshold C depend on the temperature and SOC of the battery 16. In the hybrid vehicle 100, a table that allows the current coefficient B to be specified insofar as the temperature and SOC of the battery 16 are specified and a table that allows the limit threshold C to be specified insofar as the temperature and SOC of the battery 16 are specified are stored in the memory (not illustrated). These tables are drawn up in advance through experimentation regarding a relationship between each of the current coefficient B and the limit threshold C and the temperature and SOC of the battery 16. The ECU 26 can calculate the current coefficient B and the limit threshold C by referring to these tables.

After the calculation of the current coefficient B and the limit threshold C, the ECU 26 calculates the damage value $D(+)$ that shows an increment in the degree of the deterioration of the battery 16 (S160). The damage value $D(+)$ is calculated based on a degree of an increase in the salt concentration bias resulting from the charging and discharging between the calculation of the damage value $D(N-1)$ pertaining to the immediately preceding cycle $\Delta t$ and the passage of one cycle $\Delta t$. For example, the ECU 26 can calculate the damage value $D(+)$ based on the following Formula (3).

$$D(+) = B/C \times I \times \Delta t \qquad (3)$$

In Formula (3), B represents the current coefficient and C represents the limit threshold. I represents the current value, and the current value of the current I acquired in Step S100 is used as I. $\Delta t$ represents the cycle $\Delta t$ at a time when the processing that is illustrated in FIG. 2 is repeatedly executed. As is apparent from Formula (3), the damage value $D(+)$ increases as the current value of the current I increases and the cycle $\Delta t$ lengthens. The damage value $D(+)$ is a positive value in a case where the battery 16 is discharged, whereas the damage value $D(+)$ is a negative value in a case where the battery 16 is charged. The current I has a positive value in a case where the battery 16 is discharged and the current I has a negative value in a case where the battery 16 is charged.

After the calculation of the damage value $D(+)$, the ECU 26 calculates the damage value $D(N)$ that shows the degree of the deterioration of the battery 16 (Step S170). For example, the ECU 26 can calculate the damage value $D(N)$ based on the following Formula (4).

$$D(N) = D(N-1) - D(-) + D(-) \qquad (4)$$

In Formula (4), $D(N)$ is the damage value pertaining to the present cycle. $D(N-1)$ is the damage value pertaining to the immediately preceding cycle $\Delta t$. $D(0)$ as an initial value can be, for example, 0. $D(-)$ and $D(+)$ represent a decrement and an increment in the damage value D, respectively. The values calculated in Steps S140 and S160 are used as $D(-)$ and $D(+)$, respectively.

After the calculation of the damage value D(N), the ECU 26 determines whether or not the damage value D(N) is lower than a damage value Dtar(−) determined in advance (Step S180). A reason for this determination will be described below. The technique that is disclosed in this specification is to suppress the degree of the progress of the high-rate deterioration during charging. As described above, the damage value D(N) is a negative value during charging. Accordingly, in an excessive charging situation, the damage value D(N) increases in the negative direction. In this regard, the ECU 26 monitors whether the damage value D(N) becomes a high negative-direction value. The damage value Dtar(−) is a negative value and is set to a value that is higher in a positive direction than the damage value D(N) at which the high-rate deterioration attributable to charging begins to occur.

After a determination is made that the damage value D(N) is equal to or higher than the damage value Dtar(−) (NO in Step S180), the ECU 26 stores only the damage value D(N) in the memory (not illustrated) (Step S185).

After a determination is made that the damage value D(N) is lower than the damage value Dtar(−) (YES in Step S180), the ECU 26 calculates the evaluation value ΣD(N) based on the damage value D(N) (Step S190). For example, the ECU 26 can calculate the integrated value ΣD(N) of the damage value D(N) based on the following Formula (5).

$$\Sigma D(N) = \gamma \times \Sigma D(N-1) + \eta \times D(N) \quad (5)$$

Herein, ΣD(N) is a calculated value of the evaluation value ΣD(N) pertaining to the present cycle Δt, and ΣD(N−1) is a calculated value of the evaluation value ΣD(N) pertaining to the immediately preceding cycle Δt. γ is a damping coefficient, and η is a correction factor. ΣD(N−1) is stored in the memory (not illustrated) after the calculation in the immediately preceding cycle Δt is completed and is read out from the memory in the present cycle Δt. The damping coefficient γ is set to a value that falls short of 1. Because the salt concentration bias is relaxed by the ion diffusion over time, a decrease in the evaluation value ΣD(N−1) calculated in the immediately preceding cycle Δt is taken into account during the calculation of the evaluation value ΣD(N) in the present cycle Δt. The correction factor η is appropriately set.

After calculating the evaluation value ΣD(N), the ECU 26 stores the evaluation value ΣD(N) and the damage value D(N) calculated in Step S170 in the memory (not illustrated) (Step S195). After the evaluation value ΣD(N) and the damage value D(N) are stored in the memory (not illustrated), the processing returns to Step S100 and the processing for the subsequent cycle Δt is initiated.

<3. Forced Charging Control>

Figure 3:
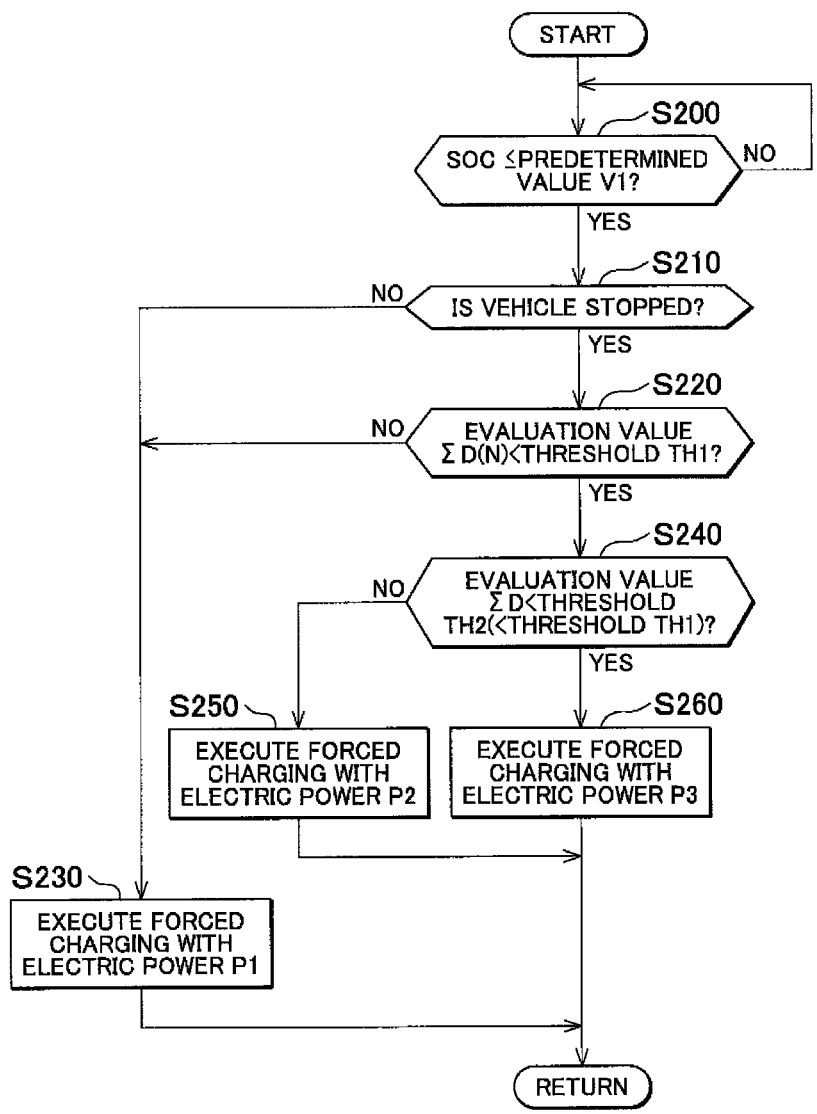
FIG. 3 is a flowchart illustrating a processing according to a forced charging control.

FIG. 3 is a flowchart illustrating a processing according to the forced charging control. The processing that is illustrated in this flowchart is executed in conjunction with the processing that is illustrated in the flowchart which is illustrated in FIG. 2. Referring to FIG. 3, the ECU 26 determines whether or not the SOC of the battery 16 is equal to or lower than a predetermined value V1 (Step S200). In the case of a determination that the SOC is not equal to or lower than the predetermined value V1 (NO in Step S200), the processing of Step S200 is executed again.

In the case of a determination that the SOC is equal to or lower than the predetermined value V1 (YES in Step S200), the ECU 26 determines whether or not the hybrid vehicle 100 is stationary (Step S210). For example, the ECU 26 can deteimine whether or not the hybrid vehicle 100 is stationary based on whether a shift lever (not illustrated) is at a parking (P) position or a neutral (N) position. Herein, the state where the vehicle is stopped may include a case where the hybrid vehicle 100 travels at a very low speed as well as a case where the hybrid vehicle 100 is completely stopped (with a vehicle speed of 0 km/h). In a case where the case where the hybrid vehicle 100 travels at a very low speed is included in the state where the vehicle is stopped, the ECU 26 can determine whether or not the hybrid vehicle 100 is stopped by referring to an output from a vehicle speed sensor (not illustrated).

In the event of a determination that the hybrid vehicle 100 is not stationary (NO in Step S210), the ECU 26 executes the forced charging of the battery 16 with a charging electric power of P1 (kW) (Step S230). Specifically, the ECU 26 controls the engine 2 to produce vehicle power that allows the charging electric power of the battery 16 attributable to the motor generator 6 to become P1 (kW). In the hybrid vehicle 100, the forced charging using the charging electric power of P1 (kW) is carried out as described above in a case where the forced charging control is executed during the traveling of the vehicle. The charging electric power is represented by a negative value whereas the discharging electric power is represented by a positive value. Accordingly, the value of the charging electric power decreases as the magnitude (absolute value) of the charging electric power increases.

In the case of a determination that the hybrid vehicle 100 is stationary (YES in Step S210), the ECU 26 determines whether or not the evaluation value ΣD(N) calculated in the processing illustrated in FIG. 2 is lower than a threshold TH1 (Step S220). This threshold TH1 is a negative value.

In a case where it is determined that the evaluation value ΣD(N) is not lower than the threshold TH1 (NO in Step S220), the ECU 26 executes the forced charging control of the battery 16 with the charging electric power of P1 (kW) (Step S230).

In a case where it is determined that the evaluation value ΣD(N) is lower than the threshold TH1 (YES in Step S220), the ECU 26 determines whether or not the evaluation value ΣD(N) is lower than a threshold TH2 (Step S240). The threshold TH2 is a negative value that is lower than the threshold TH1.

In a case where it is determined that the evaluation value ΣD(N) is not lower than the threshold TH2 (NO in Step S240), the ECU 26 executes the forced charging of the battery 16 with P2 (kW) (Step S250). P2 (kW) is a value (negative value) that exceeds P1 (kW). In other words, P2 (kW) falls short of P1 (kW) in a comparison between the absolute values of the charging electric power.

In a case where it is determined that the evaluation value ΣD(N) is lower than the threshold TH2 (YES in Step S240), the ECU 26 executes the forced charging of the battery 16 with P3 (kW) (Step S260). P3 (kW) is a value (negative value) that exceeds P2 (kW). In other words, P3 (kW) falls short of P2 (kW) in a comparison between the absolute values of the charging electric power. The processing of Step S200 is executed again after the processing of Step S260 is completed.

Figure 4:
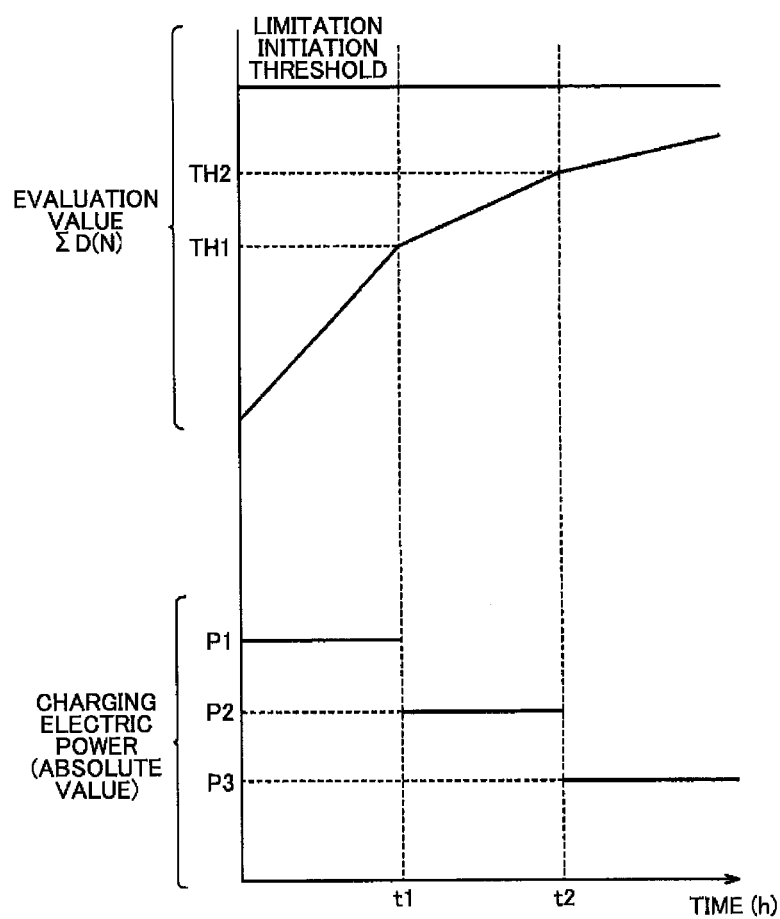
FIG. 4 is a diagram illustrating a relationship between a transition of the evaluation value that shows the degree of the high-rate deterioration of the battery and a transition of charging electric power in the forced charging control during a vehicle stop.

FIG. 4 is a diagram illustrating a relationship between a transition of the evaluation value that shows the degree of the high-rate deterioration of the battery and a transition of the charging electric power in the forced charging control during the vehicle stop. The horizontal axis in FIG. 4 represents time. The upper section in FIG. 4 represents the evaluation value ΣD(N), and shows that the high-rate deterioration attributable to charging proceeds as the evaluation value ΣD(N) goes up on the vertical axis. In this embodiment, the evaluation value ΣD(N) (negative value) decreases as the evaluation value ΣD(N) goes up on the vertical axis. The lower section in FIG. 4 represents the absolute value of the charging electric power, in which the absolute value of the charging electric power increases as the absolute value of the charging electric power goes up on the vertical axis. In other words, the magnitude of the charging electric power decreases as the absolute value of the charging electric power goes down on the vertical axis.

Referring to FIG. 4, the forced charging control during the vehicle stop is executed with the charging electric power of P1 (kW) until time t1 is reached. The evaluation value ΣD(N) decreases until time t1 is reached.

Once the evaluation value ΣD(N) reaches the threshold TH1 at time t1, the ECU 26 lowers the absolute value of the charging electric power for the forced charging control during the vehicle stop from P1 (kW) to P2 (kW). Then, an average decrement in the evaluation value ΣD(N) between time t1 and time t2 becomes smaller than an average decrement in the evaluation value ΣD(N) between time 0 and time t1. In other words, the degree of the progress of the high-rate deterioration of the battery 16 is suppressed, Once the evaluation value ΣD(N) reaches the threshold TH2 at time t2, the ECU 26 lowers the absolute value of the charging electric power for the forced charging control during the vehicle stop from P2 (kW) to P3 (kW). Then, an average decrement in the evaluation value ΣD(N) subsequent to time t2 becomes even smaller than the average decrement in the evaluation value ΣD(N) between time t1 and time t2. In other words, the degree of the progress of the high-rate deterioration of the battery 16 is further suppressed.

Although not particularly illustrated herein, the evaluation value ΣD(N) further decreases after time t2 to fall below a limitation initiation threshold, Once the evaluation value ΣD(N) falls below the limitation initiation threshold, the ECU 26 limits the input electric power upper limit value Win of the battery 16. Then, the progress of the high-rate deterioration of the battery 16 is effectively suppressed but the amount of the energy that can be recovered by the battery 16 decreases, and then the fuel efficiency of the hybrid vehicle 100 is worsened. In the hybrid vehicle 100, however, the charging electric power in the forced charging control during the vehicle stop is reduced in stages each time the evaluation value ΣD(N) falls below the thresholds TH1, TH2 before the evaluation value ΣD(N) reaches the limitation initiation threshold. Accordingly, the arrival of the evaluation value ΣD(N) at the limitation initiation threshold is delayed in stages. As a result, in the hybrid vehicle 100, the ECU 26 can suppress the degree of the decrease in the evaluation value ΣD(N) until the arrival of the evaluation value ΣD(N) at the limitation initiation threshold.

In a case where the forced charging control during the vehicle stop is executed, the ECU 26 in the hybrid vehicle 100 adopts the first electric power (P1) as the electric power for charging the secondary battery when the evaluation value ΣD(N) that shows the degree of the deterioration of the battery 16 which is attributable to the salt concentration bias of the battery 16 due to charging is equal to or higher than the threshold TH1 and adopts the second electric power (P2), which is less than the first electric power, as the electric power for charging the secondary battery when the evaluation value ΣD(N) that shows the degree of the deterioration of the battery 16 which is attributable to the salt concentration bias of the battery 16 due to charging is lower than the threshold TH1 as described above. Accordingly, the degree of the progress of the high-rate deterioration of the secondary battery is suppressed in an early stage. Accordingly, the secondary battery is unlikely to deteriorate to an extent that might require a reduction in the upper limit value of the charging electric power during the traveling.

In addition, in the case where the forced charging control during the vehicle stop is executed, the ECU 26 in the hybrid vehicle 100 adopts a third electric power (P3), which is less than the second electric power (P2), as the electric power for charging the battery 16 when the evaluation value ΣD(N) is lower than the threshold TH2 lower than the threshold TH1. Accordingly, a more appropriate charging electric power is selected in accordance with a reduction in the evaluation value ΣD(N) than in a case where the charging electric power is determined based on whether or not the evaluation value ΣD(N) falls below a threshold of one stage.

(Embodiment 2)

In Embodiment 1, the input electric power upper limit value Win is limited in response to the evaluation value ΣD(N) falling short of the limitation initiation threshold. In Embodiment 2, an example will be described in which the input electric power upper limit value Win is gradually limited in response to a decrease in the evaluation value ΣD(N) with no limitation initiation threshold provided.

The configuration that is illustrated in FIG. 1 and the controls that are illustrated in FIGS. 2 and 3 are common to Embodiment 2 and Embodiment 1. Herein, only parts of Embodiment 2 that differ from those of Embodiment 1 will be described.

Figure 5:
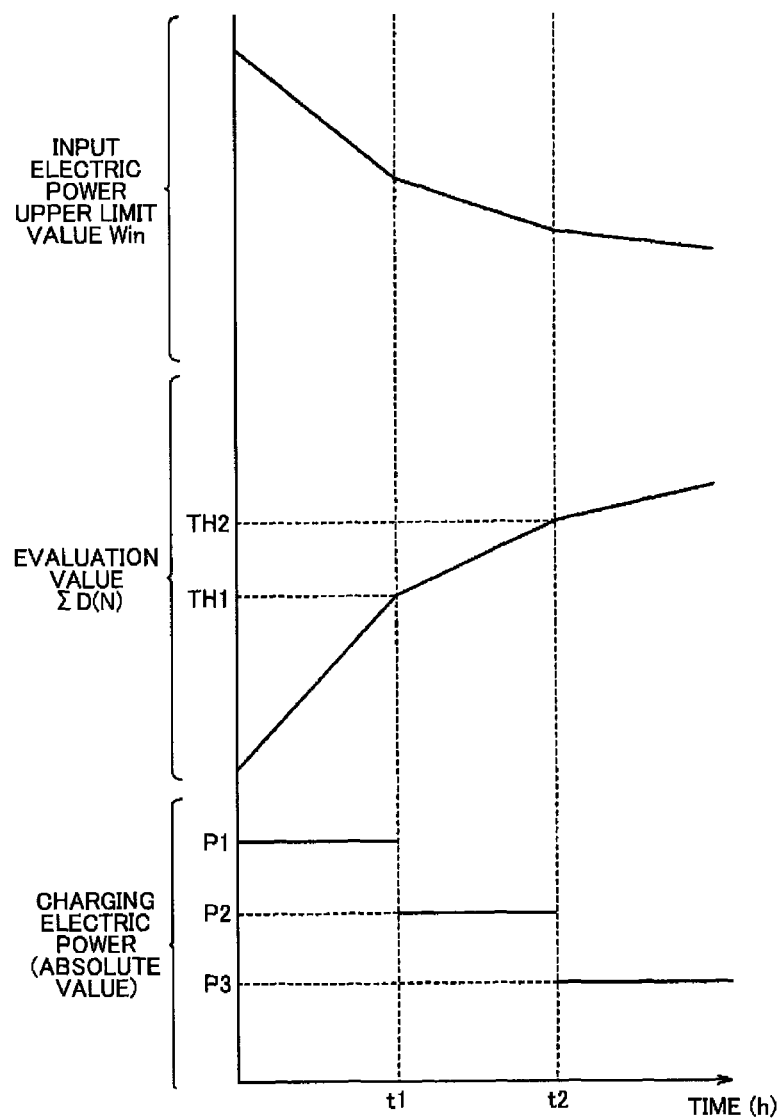
FIG. 5 is a diagram illustrating a relationship among a transition of an input electric power upper limit value, a transition of an evaluation value that shows a degree of high-rate deterioration of a battery, and a transition of charging electric power in a forced charging control during a vehicle stop according to Embodiment 2.

FIG. 5 is a diagram illustrating a relationship among a transition of the input electric power upper limit value, a transition of the evaluation value that shows the degree of the high-rate deterioration of the battery, and a transition of the charging electric power in the forced charging control during the vehicle stop according to Embodiment 2. Referring to FIG. 5, the charging electric power in the lower section is identical to that illustrated in FIG. 4. The evaluation value ΣD(N) in the middle section is identical to that illustrated in FIG. 4 except that no limitation initiation threshold is provided. The upper section shows the input electric power upper limit value of the battery 16. The input electric power upper limit value is increasingly limited as the input electric power upper limit value goes down on the vertical axis.

The forced charging control during the vehicle stop is executed with the charging electric power of P1 (kW) until time t1 is reached. The evaluation value ΣD(N) decreases and the input electric power upper limit value Win is gradually limited until time t1 is reached.

Once the evaluation value ΣD(N) reaches the threshold TH1 at time t1, the ECU 26 lowers the absolute value of the charging electric power for the forced charging control during the vehicle stop from P1 (kW) to P2 (kW). Then, an average limitation amount of the input electric power upper limit value Win between time t1 and time t2 becomes smaller than an average limitation amount of the input electric power upper limit value Win between time 0 and time t1. In other words, the limitation of the input electric power upper limit value Win is relaxed by the absolute value of the charging electric power being lowered, which results in the suppression of the worsening of the fuel efficiency.

Once the evaluation value ΣD(N) reaches the threshold TH2 at time t2, the ECU 26 further lowers the absolute value of the charging electric power for the forced charging control during the vehicle stop from P2 (kW) to P3 (kW). Then, an average limitation amount of the input electric power upper limit value Win subsequent to time t2 becomes even smaller than the average limitation amount of the input electric power upper limit value Win between time t1 and time t2. In other words, the limitation of the input electric power upper limit value Win is further relaxed by the absolute value of the charging electric power being further lowered, which results in the suppression of the worsening of the fuel efficiency.

As described above, in this embodiment, the ECU 26 limits the input electric power upper limit value Win in a more relaxed manner in a case where the electric power for charging the battery 16 in the forced charging control is P2 than in a case where the electric power for charging the battery 16 is P1. In addition, the ECU 26 limits the input electric power upper limit value Win in a more relaxed manner in a case where the electric power for charging the battery 16 is P3 than in a case where the electric power for charging the battery 16 is P2. According to this configuration, the limitation of the input electric power upper limit value Win can be relaxed by the electric power for charging the battery 16 being reduced. As a result, the worsening of the fuel efficiency can be suppressed.

(Other Embodiments)

Embodiment 1 has been described above. However, other embodiments are possible. Some of the other embodiments will be described below.

In Embodiments 1 and 2, the current sensor 24 outputs a positive value during the discharging of the battery 16 and outputs a negative value during the charging of the battery 16. However, the embodiments are not particularly limited to this configuration. For example, the current sensor 24 may be configured to output a negative value during the discharging of the battery 16 and output a positive value during the charging of the battery 16. In this case, the evaluation value $\Sigma D(N)$ is a positive value in a case where the charging-based high-rate deterioration occurs and is a negative value in a case where the discharging-based high-rate deterioration occurs. Accordingly, in the case where the forced charging control during the vehicle stop is executed, the ECU 26 determines whether or not the evaluation value $\Sigma D(N)$ exceeds a predetermined value. In a case where the evaluation value $\Sigma D(N)$ exceeds the predetermined value, the ECU 26 causes the charging electric power of the battery 16 to fall short of that of a case where the evaluation value $\Sigma D(N)$ is lower than the predetermined value. In summary, in a case where the evaluation value $\Sigma D(N)$ shows the deterioration of the battery 16 attributable to excessive charging, the ECU 26 may adopt the first electric power as the electric power for charging the battery 16 when the absolute value of the evaluation value $\Sigma D(N)$ is equal to Of lower than a threshold and may adopt the second electric power that falls short of the first electric power as the electric power for charging the battery 16 when the absolute value of the evaluation value $\Sigma D(N)$ exceeds the threshold.

In Embodiments 1 and 2, the ECU 26 determines the charging electric power at the time of the forced charging based on whether or not the evaluation value $\Sigma D(N)$ is lower than the predetermined thresholds (thresholds TH1, TH2). However, the embodiments are not particularly limited to this configuration. For example, the ECU 26 may calculate the absolute value of the evaluation value $\Sigma D(N)$ and may determine the charging electric power at the time of the forced charging based on whether or not the calculated absolute value exceeds a predeteimined threshold (positive value).

In Embodiments 1 and 2, the ECU 26 integrates the damage value D(N) itself in a case where the damage value D(N) exceeds the damage value Dtar(−) when calculating the evaluation value $\Sigma D(N)$. However, the embodiments are not particularly limited to this configuration. For example, the ECU 26 may calculate the evaluation value $\Sigma D(N)$ by integrating a difference between the damage value D(N) and the damage value Dtar(−) in a case where the damage value D(N) exceeds the damage value Dtar(−).

In Embodiments 1 and 2, the damage value D(−) is taken into account when the damage value D(N) is calculated. However, the embodiments are not particularly limited to this configuration. For example, the damage value D(N) may be calculated by the damage value D(N−1) of the immediately preceding cycle being added to the damage value D(+).

Methods for calculating the damage value D(+) and the damage value D(−) are not necessarily limited to the methods according to Embodiments 1 and 2. For example, the calculation of the damage value D(+) may follow a method by which an increase in ion concentration bias can be specified. In addition, the calculation of the damage value D(−) may follow a method by which a decrease in ion concentration bias can be specified.

In Embodiments 1 and 2, the damage value D(+) that shows the deterioration of the battery 16 attributable to excessive charging and the damage value D(+) that shows the deterioration of the battery 16 attributable to excessive discharging are represented by the same Formula (3). However, the embodiments are not particularly limited to this configuration. For example, different formulas may be provided for the damage value D(+) that shows the deterioration of the battery 16 attributable to excessive charging and the damage value D(+) that shows the deterioration of the battery 16 attributable to excessive discharging.

In Embodiments 1 and 2, the charging electric power is changed in two stages in response to a change in the evaluation value $\Sigma D(N)$ during the forced charging control during the vehicle stop. However, the embodiments are not particularly limited to this configuration. For example, the number of stages in which the charging electric power is changed may be reduced to one or increased to at least three.

In Embodiments 1 and 2, the charging electric power is changed in stages in response to a change in the evaluation value $\Sigma D(N)$ during the forced charging control during the vehicle stop. However, the embodiments are not particularly limited to this configuration. For example, the ECU 26 may reduce the electric power for charging the battery 16 as the difference between the evaluation value $\Sigma D(N)$ and a threshold increases in a case where the evaluation value $\Sigma D(N)$ reaches the threshold. Then, a more appropriate charging electric power can be selected for each evaluation value $\Sigma D(N)$.

In Embodiment 2, the input electric power upper limit value Win begins to be limited at the point in time of time 0. However, the embodiment is not particularly limited to this configuration. For example, a limitation initiation threshold may be provided as in Embodiment 1 and the limitation of the input electric power upper limit value Win may be gradually executed in response to the evaluation value $\Sigma D(N)$ falling short of the limitation initiation threshold. This example might have a configuration in which the absolute value of the charging electric power at the time of the forced charging control decreases in stages even after the evaluation value $\Sigma D(N)$ falls below the limitation initiation threshold and the limitation of the input electric power upper limit value Win is relaxed each time the absolute value of the charging electric power decreases in stages.

In Embodiments 1 and 2, the hybrid vehicle 100 is a series-parallel-type hybrid vehicle that is configured to be capable of traveling by using at least one of the engine 2 and the motor generator 10 as a driving source. However, the embodiments are not particularly limited to this configuration. For example, the hybrid vehicle 100 may be a series-type hybrid vehicle or may be a parallel-type hybrid vehicle. In summary, the hybrid vehicle 100 may be a hybrid vehicle in which the forced charging of the battery is executed when the vehicle is stationary.

In the above description, the engine 2 corresponds to an example of an "internal combustion engine" and the vehicle driving device 22 corresponds to an example of a "vehicle driving device". In addition, the battery 16 corresponds to an example of a "secondary battery", the current sensor 24 corresponds to an example of a "current sensor", and the ECU 26 corresponds to an example of a "control device" or an "electronic control unit".

The above-described embodiments are merely illustrative.

What is claimed is:

1. A hybrid vehicle comprising:
   an internal combustion engine;
   a vehicle driving device configured to (i) generate a driving force for the hybrid vehicle by receiving electric power and (ii) generate electric power from power of the internal combustion engine;
   a secondary battery inputting and outputting electric power to and from the vehicle driving device;
   a current sensor detecting a current input to and output from the secondary battery; and
   an electronic control unit configured to (a) control charging and discharging of the secondary battery, (b) calculate, using a value detected by the current sensor, an evaluation value showing a degree of deterioration of the secondary battery attributable to a salt concentration bias of the secondary battery resulting from the charging and the discharging, and (c) execute a forced charging control to charge the secondary battery by using the internal combustion engine and the vehicle driving device in a case where a remaining capacity of the secondary battery is equal to or less than a first predetermined value, the forced charging control forcibly charging the secondary battery until the remaining capacity rises to a second predetermined value exceeding the first predetermined value, wherein
   stopping of the internal combustion engine is prohibited during the execution of the forced charging control,
   an absolute value of the evaluation value increases with a progress of the deterioration of the secondary battery, and
   the electronic control unit is configured to (1) use a first electric power as an electric charging power for charging the secondary battery when the absolute value of the evaluation value is equal to or lower than a first threshold, and (2) use a second electric power falling short of the first electric power as the electric charging power for charging the secondary battery when the absolute value of the evaluation value is higher than the first threshold, in a case where the forced charging control is executed while the hybrid vehicle is stopped and in a case where the evaluation value shows the degree of the deterioration of the secondary battery that is attributable to excessive charging.

2. The hybrid vehicle according to claim 1, wherein the electronic control unit uses a third electric power falling short of the second electric power as the electric power for charging the secondary battery when the absolute value of the evaluation value is higher than a second threshold higher than the first threshold in a case where the forced charging control is executed while the hybrid vehicle is stopped.

3. The hybrid vehicle according to claim 1, wherein the electronic control unit is configured to reduce the electric power for charging the secondary battery as a difference between the absolute value of the evaluation value and the first threshold increases when the absolute value of the evaluation value is higher than the first threshold in a case where the forced charging control is executed while the hybrid vehicle is stopped.

4. The hybrid vehicle according to claim 1, wherein an input electric power upper limit value showing a limit value of the input electric power is set for the secondary battery, and
   the electronic control unit is configured to limit the input electric power upper limit value more when the absolute value of the evaluation value is higher than a third threshold higher than the first threshold than when the absolute value of the evaluation value is equal to or lower than the third threshold in a case where the forced charging control is executed while the hybrid vehicle is stopped.

5. The hybrid vehicle according to claim 1, wherein an input electric power upper limit value showing a limit value of the input electric power is set for the secondary battery, and
   the electronic control unit is configured to limit the input electric power upper limit value as the absolute value of the evaluation value increases and is configured to limit the input electric power upper limit value more gradually in a case where the electric power for charging the secondary battery is the second electric power than in a case where the electric power for charging the secondary battery is the first electric power.

6. The hybrid vehicle according to claim 1, wherein the vehicle driving device includes a motor-generator.

7. The hybrid vehicle according to claim 6, wherein the vehicle driving device includes a planetary gear mechanism coupled to the internal combustion engine and coupled to the motor-generator.

8. A method of controlling a hybrid vehicle that includes (A) an internal combustion engine; (B) a vehicle driving device configured to (i) generate a driving force for the hybrid vehicle by receiving electric power and (ii) generate electric power from power of the internal combustion engine; (C) a secondary battery that inputs and outputs electric power to and from the vehicle driving device; and (D) a current sensor that detects a current input to and output from the secondary battery, the method comprising:
   controlling, with an electronic control unit, charging and discharging of the secondary battery;
   calculating, with the electronic control unit, an evaluation value showing a degree of deterioration of the secondary battery attributable to a salt concentration bias of the secondary battery resulting from the charging and the discharging, the calculating being performed using a value detected by the current sensor; and
   executing, with the electronic control unit, a forced charging control to charge the secondary battery by using the internal combustion engine and the vehicle driving device in a case where a remaining capacity of the secondary battery is equal to or less than a first predetermined value, the forced charging control forcibly charging the secondary battery until the remaining capacity rises to a second predetermined value exceeding the first predetermined value, wherein
stopping of the internal combustion engine is prohibited during the execution of the forced charging control,
an absolute value of the evaluation value increases with a progress of the deterioration of the secondary battery, and
the electronic control unit executes the forced charging control by (1) using a first electric power as an electric charging power for charging the secondary battery when the absolute value of the evaluation value is equal to or lower than a first threshold, and (2) using a second electric power falling short of the first electric power as the electric charging power for charging the secondary battery when the absolute value of the evaluation value is higher than the first threshold, in a case where the forced charging control is executed while the hybrid vehicle is stopped and in a case where the evaluation value shows the degree of the deterioration of the secondary battery that is attributable to excessive charging.

9. The method according to claim 8, wherein
the electronic control unit executes the forced charging control using a third electric power falling short of the second electric power as the electric power for charging the secondary battery when the absolute value of the evaluation value is higher than a second threshold higher than the first threshold in a case where the forced charging control is executed while the hybrid vehicle is stopped.

10. The method according to claim 8, wherein
the electronic control unit reduces the electric power for charging the secondary battery as a difference between the absolute value of the evaluation value and the first threshold increases when the absolute value of the evaluation value is higher than the first threshold in a case where the forced charging control is executed while the hybrid vehicle is stopped.

11. The method according to claim 8, wherein
an input electric power upper limit value showing a limit value of the input electric power is set for the secondary battery, and
the electronic control unit limits the input electric power upper limit value more when the absolute value of the evaluation value is higher than a third threshold higher than the first threshold than when the absolute value of the evaluation value is equal to or lower than the third threshold in a case where the forced charging control is executed while the hybrid vehicle is stopped.

12. The method according to claim 8, wherein
an input electric power upper limit value showing a limit value of the input electric power is set for the secondary battery, and
the electronic control unit limits the input electric power upper limit value as the absolute value of the evaluation value increases and is configured to limit the input electric power upper limit value more gradually in a case where the electric power for charging the secondary battery is the second electric power than in a case where the electric power for charging the secondary battery is the first electric power.

* * * * *